US006132257A

United States Patent [19]

Wang et al.

[11] Patent Number: 6,132,257

[45] Date of Patent: Oct. 17, 2000

[54] ELECTRICAL SOCKET DEVICE WITH OVERHEATING AND OVERCURRENT PROTECTION

[75] Inventors: Robert Wang, Taipei; Jack Wang, Feng-Yuan, both of Taiwan

[73] Assignee: Ceramate Technical Co., Ltd., Tao-Yuan Hsein, Taiwan

[21] Appl. No.: 09/356,504

[22] Filed: Jul. 19, 1999

[51] Int. Cl.[7] ............................ H01H 85/00; H05K 7/00; H01R 13/66; H01R 13/68; H01R 4/52

[52] U.S. Cl. .......................... 439/622; 439/621; 439/620; 439/893; 337/4; 337/5; 337/142; 361/837

[58] Field of Search .................................... 439/622, 620, 439/621, 623, 651, 652, 893; 337/4, 5, 142, 255, 257, 260, 283, 293, 143, 144, 145; 361/837

[56] References Cited

U.S. PATENT DOCUMENTS 4,178,061 12/1979 Ahroni .................................... 439/622
5,859,580 1/1999 Hashizawa et al. .................... 337/260
5,984,728 11/1999 Chen et al. ............................. 439/620

*Primary Examiner*—Paula Bradley
*Assistant Examiner*—Edwin A. León
*Attorney, Agent, or Firm*—Foley & Lardner

[57] ABSTRACT

An electrical socket device includes a base member formed with an open top side for access to a mounting chamber. Two conductive prong engaging members are mounted on the base member inside the mounting chamber, and are formed with prong engaging portions. One of the prong engaging members is further formed with a first fuse contact. A conductive fuse contacting member is mounted on the base member inside the mounting chamber, and has a second fuse contact aligned with and spaced apart from the first fuse contact. A thermal fuse has first and second fuse terminals held removably by the fuse contacts. A cover member is mounted on the base member to cover the top side of the base member, and includes a plug engaging portion formed with prong inserting slots aligned with the prong engaging portions, and a fuse locating portion formed with an access opening for exposing the fuse contacts. A cover plate is mounted removably on the cover member to cover the access opening, and has the thermal fuse retained removably thereon such that mounting of the cover plate on the cover member will result in engagement of the thermal fuse with the fuse contacts.

5 Claims, 5 Drawing Sheets

ELECTRICAL SOCKET DEVICE WITH OVERHEATING AND OVERCURRENT PROTECTION

FIELD OF THE INVENTION

The invention relates to a socket device, more particularly to an electrical socket device with overheating and overcurrent protection.

BACKGROUND OF THE INVENTION

Referring to FIG. 1, a conventional electrical socket device is shown to include a base member 1 made from an insulator material, a pair of conductive prong engaging members 2, an electrical cable 3, and a cover member 4 also made from an insulator material.

As illustrated, the base member 1 is formed with a mounting chamber 1*a*, and an open top side for access to the mounting chamber 1*a*. The conductive prong engaging members 2 are mounted on the base member 1 inside the mounting chamber 1*a*. The conductive prong engaging members 2 are formed with three pairs of prong engaging portions 2*a*, each pair of which is adapted to engage a pair of prongs of an appliance plug (not shown). The electrical cable 3 has two insulator conductors 3*a*, 3*b* connected electrically and respectively to the prong engaging members 2 at one end, and terminated by a device plug 3*c* at the other end. The cover member 4 is mounted removably on the base member 1 to cover the top side of the base member 1, and is formed with three pairs of prong inserting holes 4*a* that are aligned with the prong engaging portions 2*a*, respectively.

Some of the disadvantages of the aforesaid conventional electrical socket device are as follows:

(a) When three plugs of three electrical appliances are inserted into the prong engaging portions 2*a* via the prong inserting holes 4*a* in the cover member 4, a relatively large amount of current will flow through the prong engaging members 2, which after long term use, will result in overheating and can lead to the outbreak of a fire.

(b) Since there is no safety device installed in the conventional electrical socket device, the user is exposed to constant danger as long as the electrical socket device is use.

SUMMARY OF THE INVENTION

The main object of this invention is to provide an electrical socket device with overheating and overcurrent protection.

Accordingly, an electrical socket device of the present invention includes a base member, a pair of conductive prong engaging members, a conductive fuse contacting member, a thermal fuse, a cover member, and a cover plate. The base member is made from an insulator material, and is formed with a mounting chamber, and an open top side for access to the mounting chamber. The conductive prong engaging members are mounted on the base member inside the mounting chamber. The prong engaging members are formed with at least one pair of prong engaging portions that are adapted to engage a pair of prongs of an appliance plug. One of the prong engaging members is further formed with a first fuse contact. The conductive fuse contacting member is mounted on the base member inside the mounting chamber, and is formed with a second fuse contact. The second fuse contact is aligned with and is spaced apart from the first fuse contact. The thermal fuse extends between and has first and second fuse terminals held removably and respectively by the first and second fuse contacts. The cover member is made from an insulator material, and is mounted on the base member to cover the top side of the base member. The cover member includes a plug engaging portion formed with at least one pair of prong inserting slots aligned with a respective pair of the prong engaging portions, and a fuse locating portion formed with an access opening for exposing the first and second fuse contacts. The cover plate is mounted removably on the cover member to cover the access opening, and has one side with the thermal fuse retained removably thereon such that mounting of the cover plate on the cover member will result in engagement of the thermal fuse with the first and second fuse contacts, and such that removal of the cover plate from the cover member will result in corresponding removal of the thermal fuse from the first and second fuse contacts.

BRIEF DESCRIPTION OF THE DRAWINGS

Other features and advantages of this invention will become more apparent in the following detailed description of the preferred embodiment of this invention, with reference to the accompanying drawings, in which.

DETAILED DESCRIPTION OF THE PREFERRED EMBODIMENT

Figure 1:
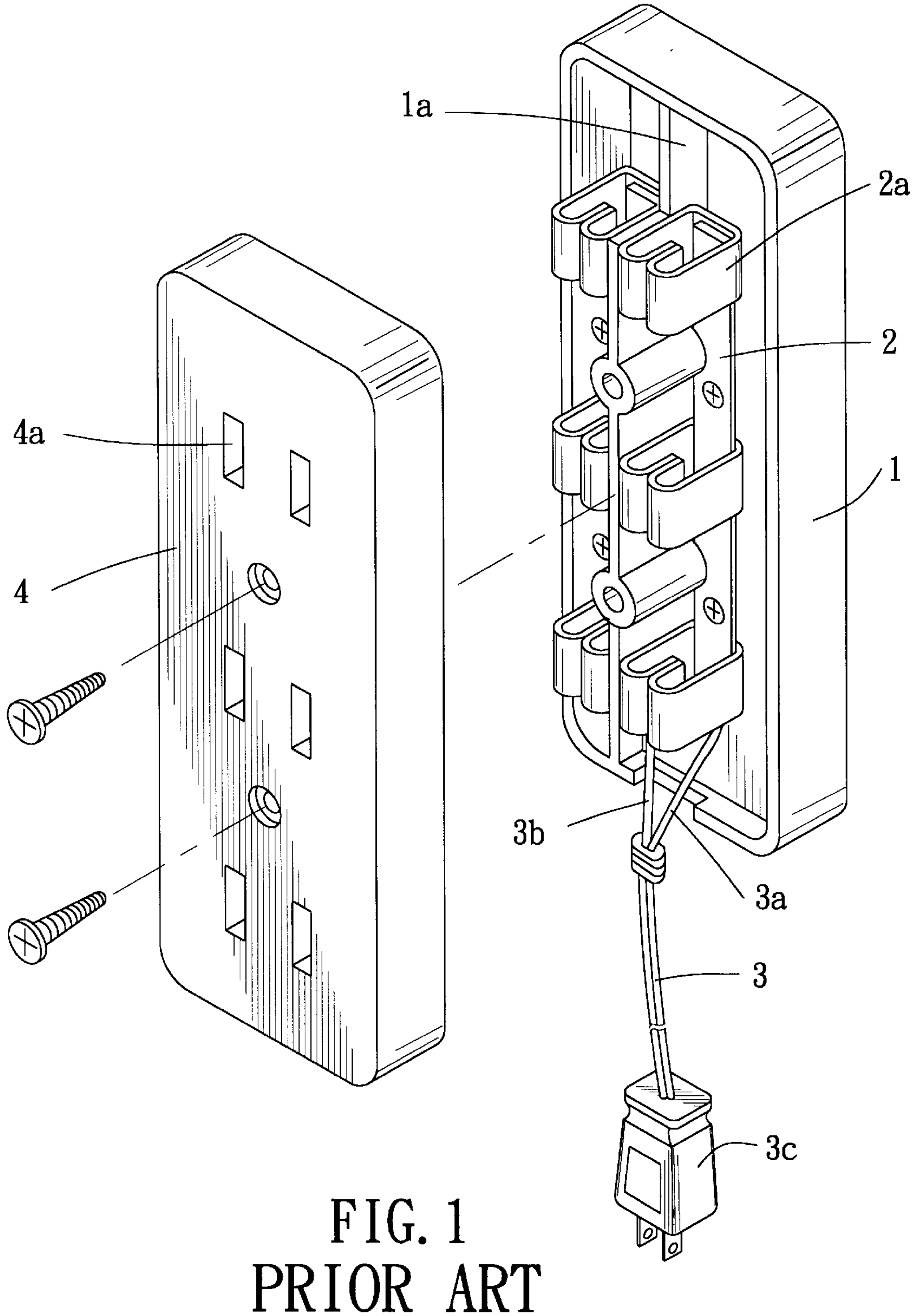
FIG. 1 PRIOR ART
FIG. 1 is an exploded view of a conventional electrical socket device.
Figure 2:
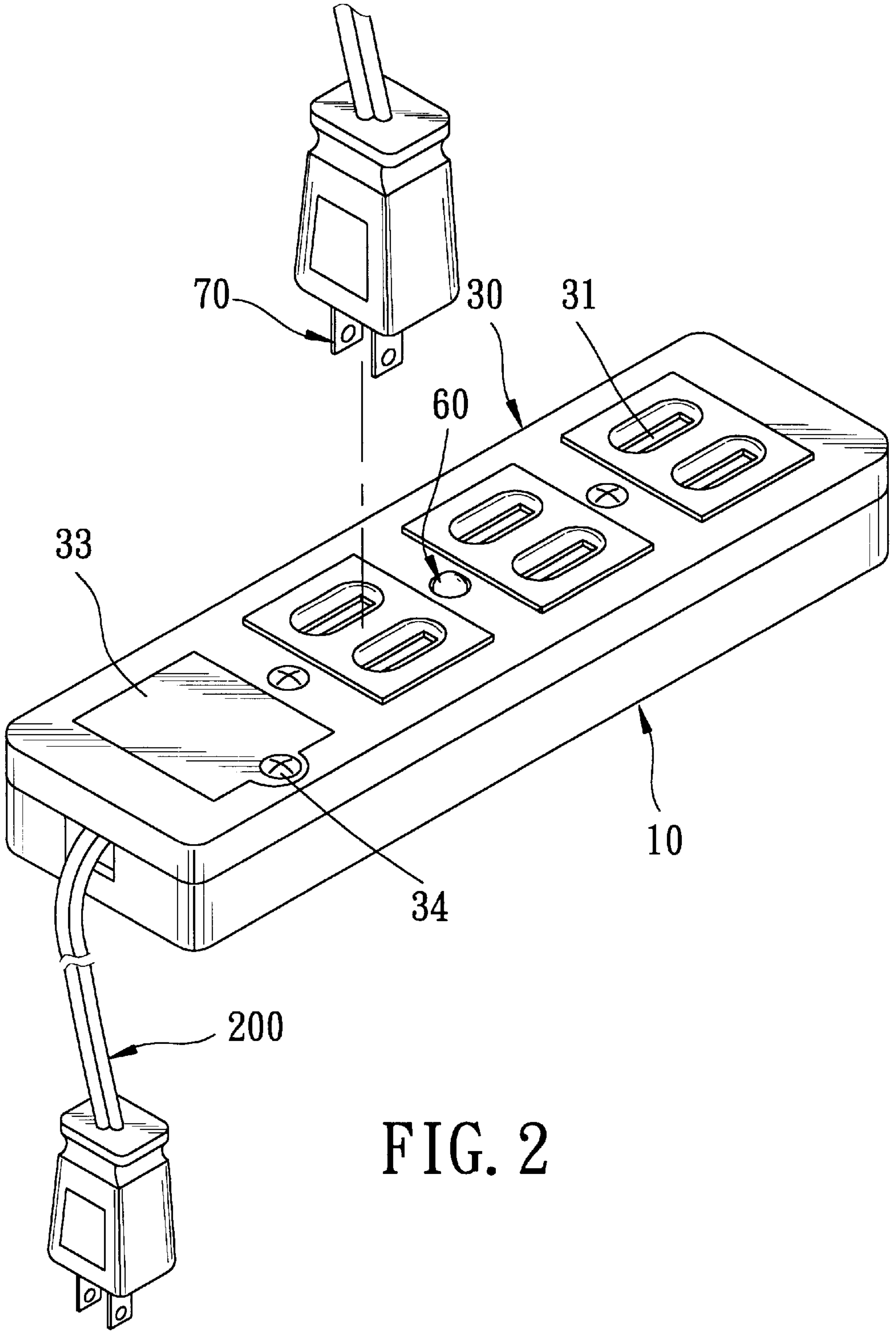
FIG. 2 is a perspective view of a preferred embodiment of an electrical socket device of the present invention.
Figure 3:
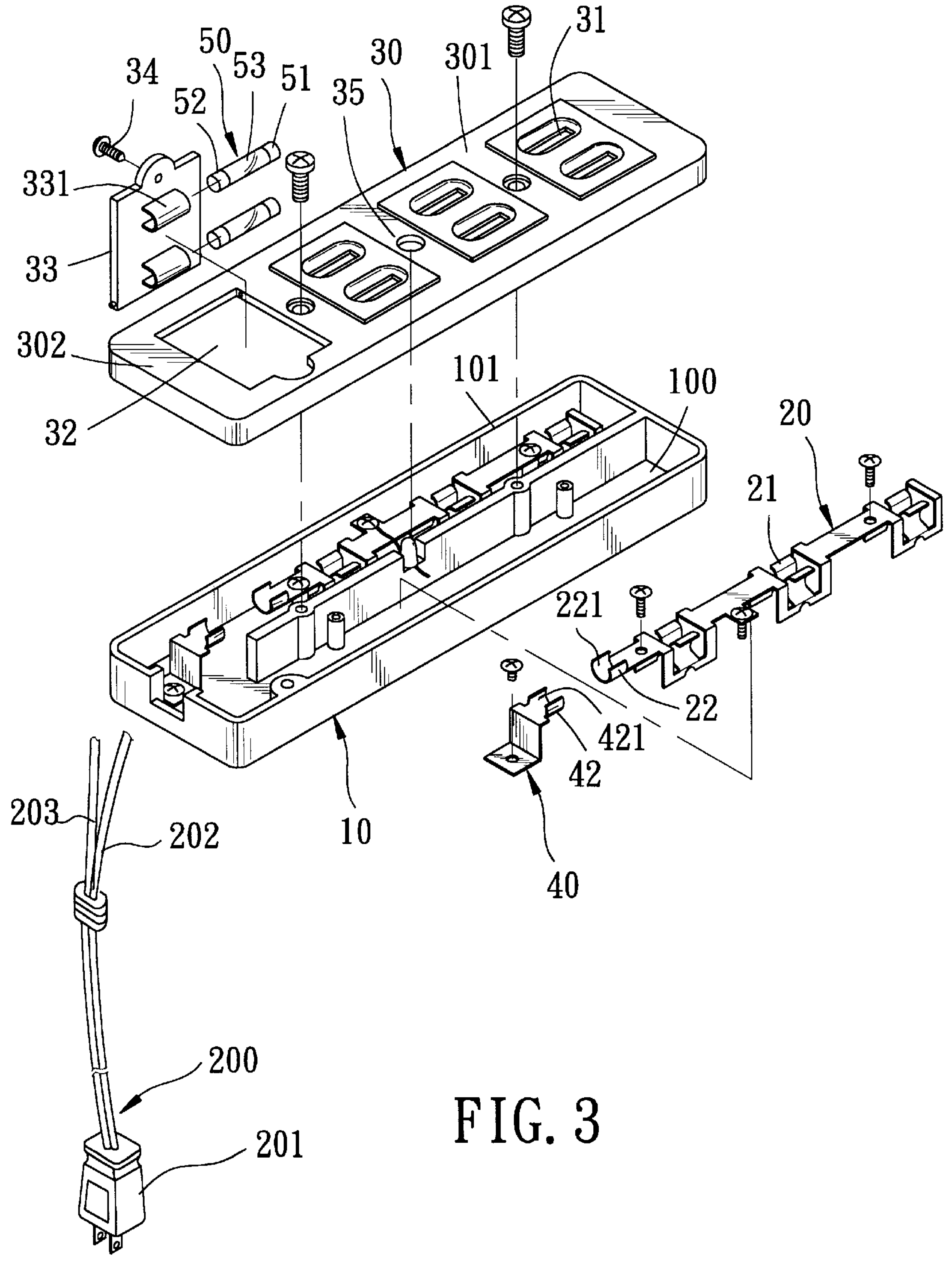
FIG. 3 is an exploded view of the preferred embodiment.
Figure 4:
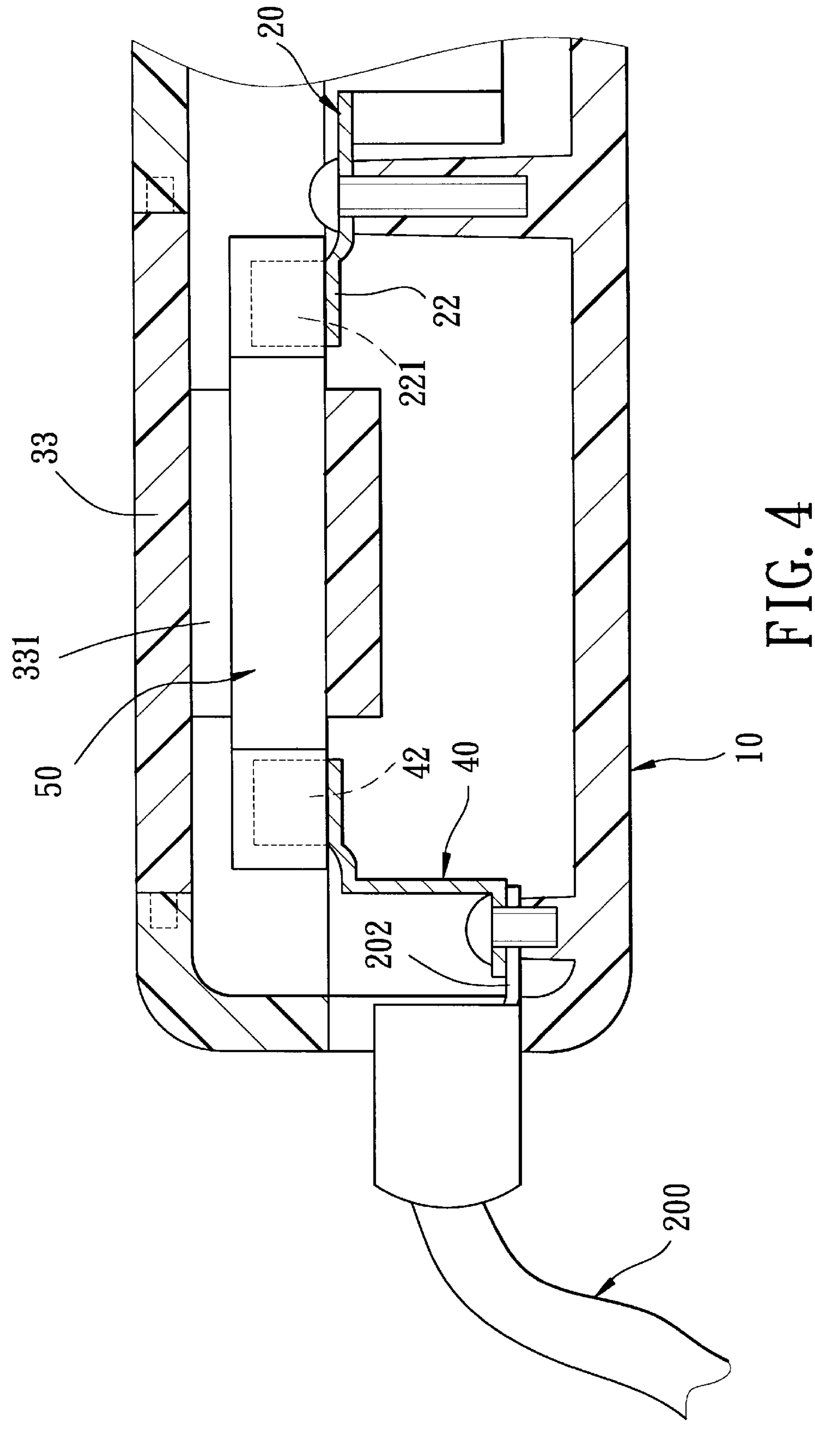
FIG. 4 is a fragmentary sectional view of the preferred embodiment.

Referring to FIGS. 2, 3 and 4, the electrical socket device of a preferred embodiment of the present invention is shown to comprise a base member 10, a pair of conductive prong engaging members 20, a pair of elongated conductive fuse contacting members 40, two thermal fuses 50, a cover member 30, a cover plate 33 and an electrical cable 200.

As illustrated, the base member 10 is elongated in shape and is made from an insulator material. The base member 10 is formed with a mounting chamber 100, and an open top side 101 for access to the mounting chamber 100.

The conductive prong engaging members 20 are mounted on the base member 10 inside the mounting chamber 100 in a parallel manner so as to extend in a longitudinal direction of the base member 10. The prong engaging members 20 are formed with three pairs of prong engaging portions 21, each pair of which is adapted to engage a pair of prongs 70 of an appliance plug. Each of the prong engaging members 20 is further formed with a first fuse contact 22 on one end.

The conductive fuse contacting members 40 are mounted on the base member 10 inside the mounting chamber 100. Each of the fuse contacting members 40 is formed with a second fuse contact 42 that is aligned with and that is spaced apart from the respective one of the first fuse contacts 22 at a distance along the longitudinal direction.

Each of the thermal fuses 50 extends between and has first and second fuse terminals 51,52 held removably and respectively by an aligned pair of the first and second fuse contacts 22, 42.

The cover member 30 is made from an insulator material, and is mounted on the base member 10 to cover the top side

Figure 5:
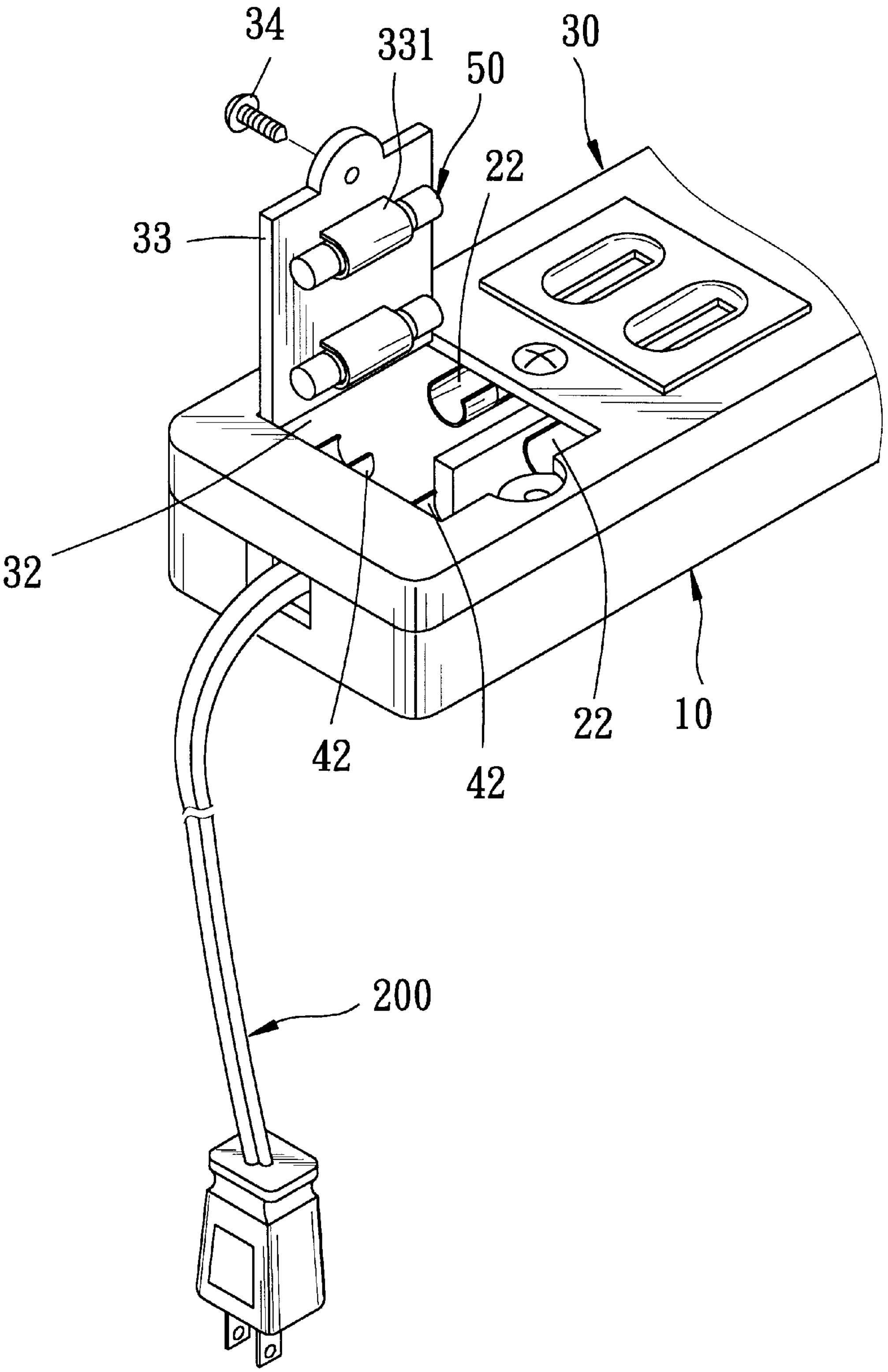
FIG. 5 is a partial view of the preferred embodiment, illustrating how installation of thermal fuses is conducted.

101 of the base member 10. The cover member 30 includes a plug engaging portion 301 that is formed with three pairs of prong inserting slots 31 aligned with a respective one of the pairs of the prong engaging portions 21, and a fuse locating portion 302 that is formed with an access opening 32 for exposing the first and second fuse contacts 22,42 (see FIG. 5).

The cover plate 33, also made from an insulator material, is mounted removably on the cover member 30 by means of a screw fastener 34 to cover the access opening 32. The cover plate 33 has a bottom side with the thermal fuses 50 retained removably thereon such that mounting of the cover plate 33 on the cover member 30 will result in engagement of the thermal fuses 50 with the first and second fuse contacts 22, 42, and such that removal of the cover plate 33 from the cover member 30 will result in corresponding removal of the thermal fuses 50 from the first and second fuse contacts 22,42.

In the preferred embodiment, the bottom side of the cover plate 33 has two fuse holding sleeves 331 mounted thereon. Each of the thermal fuses 50 has an intermediate portion 53 disposed between the first and second fuse terminals 51,52 and retained by a respective one of the fuse holding sleeves 331 on the cover plate 33. Each of the first and second fuse contacts 22, 42 is a resilient contact which defines a fuse holding groove 221, 421 with a groove access that opens upwardly for holding removably the respective one of the first and second fuse terminals 51,52. Preferably, the groove access of each of the first and second fuse contacts 22, 42 has a width slightly smaller that a diameter of the respective one of the first and second fuse terminals 51,52 such that the latter will be held firmly in the fuse holding grooves 221, 421 when the cover plate 33 is mounted on the cover member 30.

The cover member 30 is further formed with an indicator window 35. An indicator lamp 60 is mounted on the base member 10 and is connected electrically across the conductive prong engaging members 20. The lamp 60 is registered with the indicator window 35 so as to be visible from an exterior of the cover member 30, when electrical current flows through the prong engaging members 20, the indicator lamp 60 will be activated.

The electrical cable 200 has two insulated conductors 202, 203 connected electrically and respectively to the prong engaging members 20 at one end via the thermal fuses 50, and terminated by a device plug 201 at the other end.

In the event of excessive electrical current, which exceeds the rated load of the thermal fuses 50, flows into the electrical socket device of the present invention, the thermal fuses 50 will fuse and subsequently break the current flow to the prong engaging members 20, thereby preventing damage to the electrical appliances that are connected to the electrical socket device. By removing the cover plate 33 from the cover member 30, the thermal fuses 50 can be easily removed from the first and second fuse contacts 22, 42 to facilitate replacement of the same.

With this invention thus explained, it is apparent that numerous modifications and variations can be made without departing from the scope and spirit of this invention. It is therefore intended that this invention be limited only as indicated in the appended claims.

What is claimed is:

1. An electrical socket device, comprising:

a base member made from an insulator material and formed with a mounting chamber, and an open top side for access to said mounting chamber;

a pair of conductive prong engaging members mounted on said base member inside said mounting chamber, said prong engaging members being formed with at least one pair of prong engaging portions adapted to engage a pair of prongs of an appliance plug, one of said prong engaging members being further formed with a first fuse contact;

a conductive fuse contacting member mounted on said base member inside said mounting chamber, said fuse contacting member being formed with a second fuse contact that is aligned with and that is spaced apart from said first fuse contact;

a thermal fuse extending between and having first and second fuse terminals held removably and respectively by said first and second fuse contacts;

a cover member made from an insulator material and mounted on said base member to cover said top side of said base member, said cover member including a plug engaging portion formed with at least one pair of prong inserting slots aligned with a respective pair of said prong engaging portions, and a fuse locating portion formed with an access opening for exposing said first and second fuse contacts; and a cover plate mounted removably on said cover member to cover said access opening, said cover plate, having one side with said thermal fuse retained removably thereon such that mounting of said cover plate on said cover member will result in engagement of said thermal fuse with said first and second fuse contacts, and such that removal of said cover plate from said cover member will result in corresponding removal of said thermal fuse from said first and second fuse contacts, wherein said cover member is formed with an indicator window, said electrical socket device further comprising an indicator lamp mounted on said base member and connected electrically across said prong engaging members, and registered with said indicator window.

2. An electrical socket device, comprising:

a base member made from an insulator material and formed with a mounting chamber, and an open top side for access to said mounting chamber;

a pair of conductive prong engaging members mounted on said base member inside said mounting chamber, said prong engaging members being formed with at least one pair of prong engaging portions adapted to engage a pair of prongs of an appliance plug, one of said prong engaging members being further formed with a first fuse contact;

a conductive fuse contacting member mounted on said base member inside said mounting chamber, said fuse contacting member being formed with a second fuse contact that is aligned with and that is spaced apart from said first fuse contact;

a thermal fuse extending between and having first and second fuse terminals held removably and respectively by said first and second fuse contacts;

a cover member made from an insulator material and mounted on said base member to cover said top side of said base member, said cover member including a plug engaging portion formed with at least one pair of prong inserting slots aligned with a respective pair of said prong engaging portions, and a fuse locating portion formed with an access opening for exposing said first and second fuse contacts;

a cover plate mounted removably on said cover member to cover said access opening, said cover plate, having one side with said thermal fuse retained removably thereon such that mounting of said cover plate on said cover member will result in engagement of said thermal fuse with said first and second fuse contacts, and such that removal of said cover plate from said cover member will result in corresponding removal of said thermal fuse from said first and second fuse contacts; and a screw fastener for mounting removably said cover plate on said cover member.

3. An electrical socket device, comprising:

base member made from an insulator material and formed with a mounting chamber, and an open top side for access to said mounting chamber;

a pair of conductive prong engaging members mounted on said base member inside said mounting chamber, said prong engaging members being formed with at least one pair of prong engaging portions adapted to engage a pair of prongs of an appliance plugs, one of said prong engaging members being further formed with a first fuse contact;

a conductive fuse contacting member mounted on said base member inside said mounting chamber, said fuse contacting member being formed with a second fuse contact that is aligned with and that is spaced apart from said first fuse contact;

a thermal fuse extending between and having first and second fuse terminals held removably and respectively by said first and second fuse contacts;

a cover member made from an insulator material and mounted on said base member to cover said top side of said base member, said cover member including a plug engaging portion formed with at least one pair of prong inserting slots aligned with a respective pair of said prong engaging portions and a fuse locating portion formed with an access opening for exposing said first and second fuse contacts;

a cover plate mounted removably on said cover member to cover said access opening, said cover plate, having one side with said thermal fuse retained removably thereon such that mounting of said cover plate on said cover member will result in engagement of said thermal fuse with said first and second fuse contacts, and such that removal of said cover plate from said cover member will result in corresponding removal of said thermal fuse from said first and second fuse contacts; and an electrical cable having two insulated conductors connected electrically and respectively to said prong engaging members at one end, and terminated by a device plug at the other end.

4. The electrical socket device as defined in claim 3, wherein said thermal fuse connects said electrical cable in series with said one of said prong engaging members.

5. An electrical socket device, comprising:

a base member made from an insulator material and formed with a mounting chamber, and an open top side for access to said mounting chamber;

a pair of conductive prong engaging members mounted on said base member inside said mounting chamber, said prong engaging members being formed with at least one pair of prong engaging portions adapted to engage a pair of prongs of an appliance plug, one of said prong engaging members being further formed with a first fuse contact;

a conductive fuse contacting member mounted on said base member inside said mounting chamber, said fuse contacting member being formed with a second fuse contact that is aligned with and that is spaced apart from said first fuse contact;

a thermal fuse extending between and having first and second fuse terminals held removably and respectively by said first and second fuse contacts;

a cover member made from an insulator material and mounted on said base member to cover said top side of said base member, said cover member including a plug engaging portion formed with at least one pair of prong inserting slots aligned with a respective pair of said prong engaging portions, and a fuse locating portion formed with an access opening for exposing said first and second fuse contacts; and a cover plate mounted removably on said cover member to cover said access opening, said cover plate, having one side with said thermal fuse retained removably thereon such that mounting of said cover plate on said cover member will result in engagement of said thermal fuse with said first and second fuse contacts, and such that removal of said cover plate from said cover member will result in corresponding removal of said thermal fuse from said first and second fuse contacts, wherein said base member is elongated, said prong engaging members are elongated and extend parallel to each other in a longitudinal direction of said base member, said first fuse contact is formed on one end of said one of said prong engaging members, and said second fuse contact is spaced apart from said first fuse contact in the longitudinal direction.

* * * * *